US010176979B2

(12) United States Patent
Liu et al.

(10) Patent No.: US 10,176,979 B2
(45) Date of Patent: Jan. 8, 2019

(54) POST-CMP REMOVAL USING COMPOSITIONS AND METHOD OF USE

(71) Applicant: ENTEGRIS, INC., Danbury, CT (US)

(72) Inventors: Jun Liu, Brookfield, CT (US); Jeffrey A. Barnes, Bethlehem, CT (US); Emanuel I. Cooper, Scarsdale, NY (US); Laisheng Sun, Danbury, CT (US); Elizabeth Thomas, Danbury, CT (US); Jason Chang, Danbury, CT (US)

(73) Assignee: Entegris, Inc., Billerica, MA (US)

( * ) Notice: Subject to any disclaimer, the term of this patent is extended or adjusted under 35 U.S.C. 154(b) by 0 days.

(21) Appl. No.: 14/378,842

(22) PCT Filed: Feb. 15, 2013

(86) PCT No.: PCT/US2013/026326
§ 371 (c)(1),
(2) Date: Aug. 14, 2014

(87) PCT Pub. No.: WO2013/123317
PCT Pub. Date: Aug. 22, 2013

(65) Prior Publication Data
US 2016/0020087 A1 Jan. 21, 2016

Related U.S. Application Data

(60) Provisional application No. 61/599,162, filed on Feb. 15, 2012, provisional application No. 61/651,287, filed on May 24, 2012, provisional application No. 61/656,992, filed on Jun. 7, 2012, provisional application No. 61/661,160, filed on Jun. 18, 2012.

(51) Int. Cl.
| | |
|---|---|
| H01L 21/02 | (2006.01) |
| C11D 1/72 | (2006.01) |
| C11D 3/20 | (2006.01) |
| C11D 1/66 | (2006.01) |
| C11D 1/22 | (2006.01) |
| C11D 1/38 | (2006.01) |
| B08B 3/08 | (2006.01) |
| C11D 11/00 | (2006.01) |
| C11D 3/39 | (2006.01) |
| C11D 7/06 | (2006.01) |
| C11D 3/04 | (2006.01) |
| C11D 3/34 | (2006.01) |

(52) U.S. Cl.
CPC .......... *H01L 21/02074* (2013.01); *B08B 3/08* (2013.01); *C11D 1/22* (2013.01); *C11D 1/38* (2013.01); *C11D 1/66* (2013.01); *C11D 1/72* (2013.01); *C11D 3/044* (2013.01); *C11D 3/2041* (2013.01); *C11D 3/2068* (2013.01); *C11D 3/2075* (2013.01); *C11D 3/2079* (2013.01); *C11D 3/2082* (2013.01); *C11D 3/3409* (2013.01); *C11D 3/39* (2013.01); *C11D 3/3942* (2013.01); *C11D 7/06* (2013.01); *C11D 11/0047* (2013.01)

(58) Field of Classification Search
CPC .... C11D 1/22; C11D 1/38; C11D 1/66; C11D 1/72; C11D 3/044; C11D 3/2003; C11D 3/2041; C11D 3/2068; C11D 3/2079; C11D 3/2075; C11D 3/2082; C11D 3/3902; C11D 3/3942; C11D 3/3945; C11D 3/3947; C11D 3/43
USPC ....... 510/175, 176, 245, 254, 269, 272, 274, 510/372, 477, 488, 499, 500, 505, 506, 510/510
See application file for complete search history.

(56) References Cited

U.S. PATENT DOCUMENTS

| | | | |
|---|---|---|---|
| 5,320,709 A | 6/1994 | Bowden et al. | |
| 5,466,389 A | 11/1995 | Ilardi et al. | |
| 6,194,366 B1 | 2/2001 | Naghshineh et al. | |
| 6,211,126 B1 | 4/2001 | Wojtczak et al. | |
| 6,244,785 B1 | 6/2001 | Richter et al. | |
| 6,280,651 B1 | 8/2001 | Wojtczak et al. | |
| 6,306,807 B1 | 10/2001 | Wojtczak et al. | |
| 6,323,168 B1 | 11/2001 | Kloffenstein et al. | |
| 6,344,432 B1 | 2/2002 | Wojtczak et al. | |
| 6,361,407 B1 * | 3/2002 | Lu ...................... | C11D 11/0047 257/E21.23 |

(Continued)

FOREIGN PATENT DOCUMENTS

| | | |
|---|---|---|
| CN | 101366107 A | 2/2009 |
| CN | 101946310 A | 1/2011 |
| EP | 2592131 A2 | 5/2013 |
| JP | 2012036750 A | 2/2012 |
| JP | 2012062572 A | 3/2012 |
| JP | 2012186470 A | 9/2012 |
| JP | 2012251026 A | 12/2012 |
| WO | 2006110645 A2 | 10/2006 |

(Continued)

OTHER PUBLICATIONS

Supplementary European Search Report, dated Sep. 2, 2015.

(Continued)

*Primary Examiner* — Gregory R Delcotto
(74) *Attorney, Agent, or Firm* — Entegris, Inc.

(57) ABSTRACT

An amine-free composition and process for cleaning post-chemical mechanical polishing (CMP) residue and contaminants from a microelectronic device having said residue and contaminants thereon. The amine-free composition preferably includes at least one oxidizing agent, at least one complexing agent, at least one basic compound, and water and has a pH in the range from about 2.5 to about 11.5. The composition achieves highly efficacious cleaning of the post-CMP residue and contaminant material from the surface of the microelectronic device without compromising the low-k dielectric material or the copper interconnect material.

21 Claims, No Drawings

(56) References Cited

U.S. PATENT DOCUMENTS

| | | |
|---|---|---|
| 6,492,308 B1 | 12/2002 | Naghshineh et al. |
| 6,566,315 B2 | 5/2003 | Wojtczak et al. |
| 6,599,370 B2 | 7/2003 | Skee |
| 6,627,587 B2 | 9/2003 | Naghshineh et al. |
| 6,723,691 B2 | 4/2004 | Naghshineh et al. |
| 6,755,989 B2 | 6/2004 | Wojtczak et al. |
| 6,773,873 B2 | 8/2004 | Seijo et al. |
| 6,849,200 B2 | 2/2005 | Baum et al. |
| 6,875,733 B1 | 4/2005 | Wojtczak et al. |
| 6,896,826 B2 | 5/2005 | Wojtczak et al. |
| 7,365,045 B2 | 4/2008 | Walker et al. |
| 7,387,964 B2 | 6/2008 | So et al. |
| 7,534,752 B2 | 5/2009 | Wojtczak et al. |
| 7,537,709 B2 | 5/2009 | Cooper et al. |
| 7,736,405 B2 | 6/2010 | Darsillo et al. |
| 7,888,301 B2 | 2/2011 | Bernhard et al. |
| 7,922,824 B2 | 4/2011 | Minsek et al. |
| 7,923,423 B2 | 4/2011 | Walker et al. |
| 7,960,328 B2 | 6/2011 | Visintin et al. |
| 7,976,723 B2 | 7/2011 | Rath et al. |
| 7,977,292 B2 | 7/2011 | Matsunaga et al. |
| 7,994,108 B2 | 8/2011 | Minsek et al. |
| 8,026,200 B2 | 9/2011 | Cooper et al. |
| 8,058,219 B2 | 11/2011 | Rath et al. |
| 8,092,707 B2 | 1/2012 | Hardy et al. |
| 8,236,485 B2 | 8/2012 | Minsek et al. |
| 8,338,087 B2 | 12/2012 | Rath et al. |
| 8,618,036 B2 | 12/2013 | Afzali-Ardakani et al. |
| 8,685,909 B2 | 4/2014 | Angst et al. |
| 8,754,021 B2 | 6/2014 | Barnes et al. |
| 8,778,210 B2 | 7/2014 | Cooper et al. |
| 2002/0077259 A1* | 6/2002 | Skee ............... C11D 3/0073 510/175 |
| 2002/0102852 A1 | 8/2002 | Verhaverbeke et al. |
| 2005/0145311 A1 | 7/2005 | Walker et al. |
| 2005/0236601 A1 | 10/2005 | Liu et al. |
| 2005/0239673 A1 | 10/2005 | Hsu et al. |
| 2006/0063687 A1 | 3/2006 | Minsek et al. |
| 2006/0148666 A1 | 7/2006 | Peters et al. |
| 2006/0175298 A1* | 8/2006 | Zhao ............... B24B 37/044 216/88 |
| 2007/0060490 A1* | 3/2007 | Skee ............... C11D 3/0073 510/175 |
| 2007/0251551 A1 | 11/2007 | Korzenski et al. |
| 2008/0076688 A1 | 3/2008 | Barnes et al. |
| 2008/0099717 A1* | 5/2008 | Stinson ............ C09K 13/02 252/79.1 |
| 2008/0125342 A1 | 5/2008 | Visintin et al. |
| 2008/0242574 A1 | 10/2008 | Rath et al. |
| 2009/0008600 A1* | 1/2009 | Jia ............... B23H 5/08 252/79.1 |
| 2009/0032766 A1 | 2/2009 | Rajaratnam et al. |
| 2009/0212021 A1 | 8/2009 | Bernhard et al. |
| 2010/0043824 A1 | 2/2010 | Greeley et al. |
| 2010/0056410 A1 | 3/2010 | Visintin et al. |
| 2010/0065530 A1 | 3/2010 | Walker et al. |
| 2010/0112728 A1 | 5/2010 | Korzenski et al. |
| 2010/0163788 A1 | 7/2010 | Visintin et al. |
| 2010/0261632 A1 | 10/2010 | Korzenski et al. |
| 2010/0286014 A1 | 11/2010 | Barnes |
| 2010/0319735 A1 | 12/2010 | Hidaka et al. |
| 2011/0039747 A1 | 2/2011 | Zhou et al. |
| 2011/0117751 A1 | 5/2011 | Sonthalia et al. |
| 2011/0151671 A1 | 6/2011 | Barr et al. |
| 2012/0015857 A1 | 1/2012 | Chen et al. |
| 2012/0028870 A1 | 2/2012 | Barnes et al. |
| 2012/0283163 A1 | 11/2012 | Barnes et al. |
| 2013/0045597 A1 | 2/2013 | Kamada et al. |
| 2013/0045908 A1 | 2/2013 | Cui |
| 2013/0143785 A1 | 6/2013 | Taniguchi et al. |
| 2013/0157472 A1 | 6/2013 | Cui |
| 2013/0203643 A1 | 8/2013 | Nakanishi et al. |
| 2013/0270217 A1 | 10/2013 | Yoshida et al. |
| 2013/0280123 A1 | 10/2013 | Chen et al. |
| 2013/0296214 A1 | 11/2013 | Barnes et al. |
| 2013/0303420 A1 | 11/2013 | Cooper et al. |
| 2014/0038420 A1 | 2/2014 | Chen et al. |
| 2014/0238953 A1 | 8/2014 | Kojima et al. |
| 2014/0318584 A1 | 10/2014 | Cooper et al. |
| 2015/0000697 A1 | 1/2015 | Minsek et al. |

FOREIGN PATENT DOCUMENTS

| | | |
|---|---|---|
| WO | 2007027522 A2 | 3/2007 |
| WO | 2008157345 A2 | 12/2008 |
| WO | 2010017160 A2 | 2/2010 |
| WO | 2010039936 A2 | 4/2010 |
| WO | 2010086745 A1 | 8/2010 |
| WO | 2010091045 A2 | 8/2010 |
| WO | 2012051380 A2 | 4/2012 |
| WO | 2012174518 A2 | 12/2012 |
| WO | 2013101907 A1 | 7/2013 |
| WO | 2013138276 A1 | 9/2013 |
| WO | 2013138278 A1 | 9/2013 |
| WO | 2014089196 A1 | 6/2014 |

OTHER PUBLICATIONS

Chinese Office Action, dated Oct. 26, 2015.
International Search Report, dated Jun. 14, 2013.
"Merck Index," an encyclopedia of Chemicals, drugs, and biologicals, 11th Edition, pp. 938 (1989).

* cited by examiner

POST-CMP REMOVAL USING COMPOSITIONS AND METHOD OF USE

CROSS REFERENCE TO RELATED APPLICATIONS

This application is filed under the provisions of 35 U.S.C. § 371 and claims the priority of International Patent Application No. PCT/US2013/026326 filed on 15 Feb. 2013 entitled "POST-CMP REMOVAL USING COMPOSITIONS AND METHOD OF USE" in the name of Jun LIU, et al., which claims priority to U.S. Provisional Patent Application No. 61/599,162, filed on 15 FEB. 2012, U.S. Provisional Patent Application No. 61/561,287 filed on 24 May 2012, U.S. Provisional Patent Application No. 61/656,992, filed on 7 Jun. 2012, and U.S. Provisional Patent Application No. 61/661,160, filed on 18 Jun. 2012, all of which are hereby incorporated by reference herein in their entirety.

CROSS REFERENCE TO RELATED APPLICATIONS

This application claims priority to U.S. Provisional Patent Application No. 61/599,162 filed Feb. 15, 2012 in the name of Jun Liu, Jeffrey Barnes, Emanuel I. Cooper, Laisheng Sun, Steven Medd, Jieh-Hwa Shyu, Lucy Dai, and Zachary Wan entitled "Improved Post-Chemical Mechanical Polishing Formulations and Methods of Using Same," to U.S. Provisional Patent Application No. 61/651,287 filed May 24, 2012 in the name of Jun Liu, Jeffrey A. Barnes, Laisheng Sun, and Elizabeth Thomas entitled "Low pH Post-CMP Residue Removal Composition and Method of Use," to U.S. Provisional Patent Application No. 61/656,992 filed Jun. 7, 2012 in the name of Jun Liu, Jeffrey A. Barnes, Laisheng Sun, and Elizabeth Thomas entitled "Low pH Post-CMP Residue Removal Composition and Method of Use," and to U.S. Provisional Patent Application No. 61/661,160 filed Jun. 18, 2012 in the name Jun Liu, Jeffrey A. Barnes, Emanuel I. Cooper, Laisheng Sun, Elizabeth Thomas, and Jason Chang entitled "Post-CMP Removal Using Compositions Comprising Surfactant," each of which is incorporated by reference herein in their entirety.

FIELD OF THE INVENTION

The present invention relates to amine-free compositions for substantially and efficiently cleaning residue and/or contaminants from microelectronic devices having same thereon.

DESCRIPTION OF THE RELATED ART

It is well known that integrated circuit (IC) manufacturers have replaced aluminum and aluminum alloys with copper for advanced microelectronic applications because copper has a higher conductivity that translates to significant improvement in the interconnect performance. In addition, copper-based interconnects offer better electromigration resistance than aluminum, thereby improving the interconnect reliability. That said, the implementation of copper faces certain challenges. For example, the adhesion of copper (Cu) to silicon dioxide ($SiO_2$) and to other dielectric materials is generally poor. Poor adhesion results in the delamination of Cu from adjoining films during the manufacturing process. Also, Cu ions readily diffuse into $SiO_2$ under electrical bias, and increase the dielectric electrical leakage between Cu lines even at very low Cu concentrations within the dielectric. In addition, if copper diffuses into the underlying silicon where the active devices are located, device performance can be degraded.

The problem of the high diffusivity of copper in silicon dioxide ($SiO_2$), and in other inter-metal dielectrics (IMDs)/interlevel dielectrics (ILDs), remains of great concern. To deal with this issue, an integrated circuit substrate must be coated with a suitable barrier layer that encapsulates copper and blocks diffusion of copper atoms. The barrier layer, comprising both conductive and non-conductive materials, is typically formed over a patterned dielectric layer and prior to deposition of copper. Typical materials for the barrier layer include tantalum (Ta), tantalum nitride ($TaN_x$), tungsten (W), titanium (Ti), titanium nitride (TiN), ruthenium (Ru), cobalt (Co), molybdenum (Mo), rhenium (Rh), and alloys thereof.

In the manufacturing of deep submicron semiconductors, the copper damascene process is used to form conductive copper lines and vias in the low-k dielectric layer. One important step of the damascene process is copper chemical mechanical polishing (CMP) for the removal of excess copper above the dielectric layer surface. The CMP process involves holding and rotating a thin, flat substrate of the semiconductor device against a wetted polishing pad under controlled pressure and temperature in the presence of CMP slurries. The slurries contain abrasive materials and chemical additives as appropriate to the specific CMP process and requirements. Following the CMP process, contaminants consisting of particles from the polishing slurry, chemicals added to the slurry, and reaction by-products of the polishing slurry are left behind on the wafer surface. All contaminants must be removed prior to any further steps in the microelectronic device fabrication process to avoid degradation of device reliability and introduction of defects into the device. Often, particles of these contaminants are smaller than 0.3 µm.

One particular issue in this respect is the residues that are left on the microelectronic device substrate following CMP processing. Such residues include CMP material and corrosion inhibitor compounds such as benzotriazole (BTA). If not removed, these residues can cause damage to copper lines or severely roughen the copper metallization, as well as cause poor adhesion of post-CMP applied layers on the device substrate. Severe roughening of copper metallization is particularly problematic, since overly rough copper can cause poor electrical performance of the product microelectronic device. Towards that end, post-CMP removal compositions have been developed to remove the post-CMP residue and contaminants.

Conventional cleaning techniques use fluid flow of a cleaning solution, e.g., alkaline solutions based on ammonium hydroxide, over the wafer surface in combination with megasonics, jetting or brushing to remove contaminants Said cleaning solutions remove the contaminants by attacking the wafer surface or reacting with the contaminants before removing the dislodged contaminants from the wafer. Disadvantageously, some of the contaminants may be chemically inert to the chemical ingredients in the cleaning solutions. Furthermore, the amine-containing cleaning solutions known in the art smell and release amine vapors into the fab which can poison photoresist.

It would be a significant advance in the art to provide improved amine-free compositions for post-CMP cleaning of the microelectronic devices, for the substantially defect-free and substantially scratch-free removal of CMP residue and contaminants from the surface of said device. Said aqueous compositions effectuate substantial residue and contaminant removal from the surface of the device without damaging the exposed low-k dielectric material and interconnect and via materials, e.g., copper and/or aluminum containing materials.

SUMMARY OF THE INVENTION

The present invention generally relates to an amine-free composition and process for cleaning residue and/or contaminants from microelectronic devices having said residue and contaminants thereon. In one aspect, the compositions described herein comprise, consist of, or consist essentially of at least one oxidizing agent, at least one complexing agent, at least one basic compound, at least one buffering agent, and water, wherein the composition is substantially devoid of amines, quaternary bases, fluoride-containing sources, and abrasive material typically used in chemical mechanical polishing processes. Optionally, the cleaning composition may further include at least one solvating agent, at least one surfactant, or both. The residue may include post-CMP residue.

In another aspect, the invention relates to a kit comprising, in one or more containers, one or more of the following reagents for forming an amine-free composition, said one or more reagents selected from the group consisting of at least one oxidizing agent, at least one complexing agent, at least one basic compound, at least one buffering agent, and water, wherein the composition is substantially devoid of amines, quaternary bases, fluoride-containing sources, and abrasive material typically used in chemical mechanical polishing processes, and wherein the kit is adapted to form an amine-free composition suitable for cleaning post-CMP residue and contaminants from a microelectronic device having said residue and contaminants thereon. The at least one oxidizing agent can be added to the amine-free composition at or upstream of the cleaning apparatus.

In yet another aspect, the present invention relates to a method of cleaning residue and contaminants from a microelectronic device having said residue and contaminants thereon, said method comprising contacting the microelectronic device with an amine-free composition for sufficient time to at least partially clean said residue and contaminants from the microelectronic device, wherein the amine-free composition comprises at least one oxidizing agent, at least one complexing agent, at least one basic compound, at least one buffering agent, and water, wherein the composition is substantially devoid of amines, quaternary bases, fluoride-containing sources, and abrasive material typically used in chemical mechanical polishing processes. The residue may include post-CMP residue.

In another aspect, the present invention relates to a method of removing post-CMP residue and contaminants from a microelectronic device having same thereon, said method comprising:
    polishing the microelectronic device with a CMP slurry;
    contacting the microelectronic device with an amine-free composition comprising at least one oxidizing agent, at least one complexing agent, at least one basic compound, at least one buffering agent, and water, wherein the composition is substantially devoid of amines, quaternary bases, fluoride-containing sources, and abrasive material typically used in chemical mechanical polishing processes, for a sufficient time to substantially remove post-CMP residue and contaminants from the microelectronic device.

In still another aspect, the present invention relates to a method of cleaning a microelectronic device having residue and contaminants thereon, said method comprising contacting the microelectronic device with an amine-free composition for sufficient time to remove residue and contaminants from the microelectronic device having same thereon, wherein said composition comprises at least one oxidizing agent, at least one complexing agent, at least one basic compound, at least one buffering agent, and water, wherein the composition is substantially devoid of amines, quaternary bases, fluoride-containing sources, and abrasive material typically used in chemical mechanical polishing processes.

In still another aspect, the present invention relates to a method of cleaning a microelectronic device having post-CMP residue and contaminants thereon, said method comprising contacting the microelectronic device with an amine-free composition for sufficient time to remove post-CMP residue and contaminants from the microelectronic device having same thereon, wherein said composition comprises at least one oxidizing agent, at least one complexing agent, at least one basic compound, at least one buffering agent, and water, wherein the composition is substantially devoid of amines, quaternary bases, fluoride-containing sources, and abrasive material typically used in chemical mechanical polishing processes.

In a further aspect, the present invention relates to a method of manufacturing a microelectronic device, said method comprising contacting the microelectronic device with an amine-free cleaning composition described herein for sufficient time to at least partially clean post-CMP residue and contaminants from the microelectronic device having said residue and contaminants thereon.

Yet another aspect of the invention relates to improved microelectronic devices, and products incorporating same, made using the methods of the invention comprising cleaning of post-CMP residue and contaminants from the microelectronic device having said residue and contaminants thereon, using the methods and/or compositions described herein, and optionally, incorporating the microelectronic device into a product.

Another aspect of the invention relates to an article of manufacture comprising an amine-free cleaning composition, a microelectronic device wafer, and post-CMP residue and contaminants, wherein the amine-free cleaning composition comprises at least one oxidizing agent, at least one complexing agent, at least one basic compound, at least one buffering agent, and water, wherein the composition is substantially devoid of amines, quaternary bases, fluoride-containing sources, and abrasive material typically used in chemical mechanical polishing processes.

Other aspects, features and advantages of the invention will be more fully apparent from the ensuing disclosure and appended claims.

DETAILED DESCRIPTION OF THE INVENTION, AND PREFERRED EMBODIMENTS THEREOF

The present invention relates generally to amine-free compositions that clean post-CMP residue and contaminants from a microelectronic device having said residue and contaminants thereon. The cleaning compositions are compatible with the exposed materials, while substantially removing the post-CMP residue and contaminants from the surface of the microelectronic device.

For ease of reference, "microelectronic device" corresponds to semiconductor substrates, flat panel displays, phase change memory devices, solar panels and other products including solar substrates, photovoltaics, and microelectromechanical systems (MEMS), manufactured for use in microelectronic, integrated circuit, or computer chip applications. It is to be understood that the term "microelectronic device" is not meant to be limiting in any way and includes any substrate that will eventually become a microelectronic device or microelectronic assembly.

As used herein, "residue" corresponds to particles generated during the manufacture of a microelectronic device including, but not limited to, plasma etching, ashing, chemical mechanical polishing, wet etching, and combinations thereof.

As used herein, "contaminants" correspond to chemicals present in the CMP slurry, e.g., benzotriazole (BTA), reaction by-products of the polishing slurry, chemicals present in the wet etching composition, reaction by products of the wet etching composition, and any other materials that are the by-products of the CMP process, the wet etching, the plasma etching or the plasma ashing process.

As used herein, "post-CMP residue" corresponds to particles from the polishing slurry, e.g., silica-containing particles, chemicals present in the slurry, reaction by-products of the polishing slurry, carbon-rich particles, polishing pad particles, brush deloading particles, equipment materials of construction particles, copper, copper oxides, organic residues, and any other materials that are the by-products of the CMP process.

As defined herein, "low-k dielectric material" corresponds to any material used as a dielectric material in a layered microelectronic device, wherein the material has a dielectric constant less than about 3.5. Preferably, the low-k dielectric materials include low-polarity materials such as silicon-containing organic polymers, silicon-containing hybrid organic/inorganic materials, organosilicate glass (OSG), TEOS, fluorinated silicate glass (FSG), silicon dioxide, carbon-doped oxide (CDO) glass, CORAL™ from Novellus Systems, Inc., BLACK DIAMOND™ from Applied Materials, Inc., SiLK™ from Dow Corning, Inc., and NANOGLASS™ of Nanopore, Inc, and the like. It is to be appreciated that the low-k dielectric materials may have varying densities and varying porosities.

As defined herein, "clean amine-free compositions" correspond to the amine-free compositions just prior to contact with the microelectronic device having post-CMP and/or contaminants thereon.

As defined herein, "complexing agent" includes those compounds that are understood by one skilled in the art to be complexing agents, chelating agents and/or sequestering agents. Complexing agents will chemically combine with or physically hold the metal atom and/or metal ion to be removed using the compositions of the present invention.

As defined herein, the term "barrier material" corresponds to any material used in the art to seal the metal lines, e.g., copper interconnects, to minimize the diffusion of said metal, e.g., copper, into the dielectric material. Conventional barrier layer materials include tantalum or titanium, their nitrides and silicides, and alloys thereof. Candidate materials that could serve as directly plateable diffusion barriers include ruthenium (Ru), cobalt (Co), tungsten (W), molybdenum (Mo), rhenium (Rh), and alloys thereof.

As used herein, "about" is intended to correspond to ±5% of the stated value.

"Substantially devoid" is defined herein as less than 2 wt. %, preferably less than 1 wt. %, more preferably less than 0.5 wt. %, even more preferably less than 0.1 wt. %, and most preferably 0 wt %.

As defined herein, "post-etch residue" corresponds to material remaining following gas-phase plasma etching processes, e.g., BEOL dual damascene processing. The post-etch residue may be organic, organometallic, organosilicic, or inorganic in nature, for example, silicon-containing material, carbon-based organic material, and etch gas residue including, but not limited to, oxygen and fluorine. "Post-ash residue," as used herein, corresponds to material remaining following oxidative or reductive plasma aching to remove hardened photoresist and/or bottom anti-reflective coating (BARC) materials. The post-ash residue may be organic, organometallic, organosilicic, or inorganic in nature.

It is understood to the skilled artisan that ammonium hydroxide ($NH_4OH$) can be used interchangeably with ammonia ($NH_3$) when the composition is aqueous.

For the purposes of this invention, an "amine" is defined as at least one primary, secondary, or tertiary amine, with the proviso that (i) an amide group, (ii) species including both a carboxylic acid group and an amine group (e.g., amino acids), (iii) ammonia, (iv) surfactants that include amine groups, and (v) amine-N-oxides are not considered "amines" according to this definition. The amine formula can be represented by $NR^1R^2R^3$, wherein $R^1$, $R^2$ and $R^3$ can be the same as or different from one another and are selected from the group consisting of hydrogen, straight-chained or branched $C_1$-$C_6$ alkyls (e.g., methyl, ethyl, propyl, butyl, pentyl, hexyl), $C_6$-$C_{10}$ aryls (e.g., benzyl), straight-chained or branched $C_1$-$C_6$ alkanols (e.g., methanol, ethanol, propanol, butanol, pentanol, hexanol), and combinations thereof.

As used herein, "suitability" for cleaning residue and contaminants from a microelectronic device having said residue and contaminants thereon corresponds to at least partial removal of said residue/contaminants from the microelectronic device. Cleaning efficacy is rated by the reduction of objects on the microelectronic device. For example, pre- and post-cleaning analysis may be carried out using an atomic force microscope. The particles on the sample may be registered as a range of pixels. A histogram (e.g., a Sigma Scan Pro) may be applied to filter the pixels in a certain intensity, e.g., 231-235, and the number of particles counted. The particle reduction may be calculated using:

$$\text{Cleaning Efficacy} = \frac{\left(\begin{array}{c}\text{Number of PreClean Objects} -\\ \text{Number of PostClean Objects}\end{array}\right)}{\text{Number of PreClean Objects}} \times 100$$

Notably, the method of determination of cleaning efficacy is provided for example only and is not intended to be limited to same. Alternatively, the cleaning efficacy may be considered as a percentage of the total surface that is covered by particulate matter. For example, AFM's may be programmed to perform a z-plane scan to identify topographic areas of interest above a certain height threshold and then calculate the area of the total surface covered by said areas of interest. One skilled in the art would readily understand that the less area covered by said areas of interest post-cleaning, the more efficacious the cleaning composition. Preferably, at least 75% of the residue/contaminants are removed from the microelectronic device using the compositions described herein, more preferably at least 90%, even more preferably at least 95%, and most preferably at least 99% of the residue/contaminants are removed.

Compositions of the invention may be embodied in a wide variety of specific formulations, as hereinafter more fully described.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.001 weight percent, based on the total weight of the composition in which such components are employed.

In a first aspect, the present invention relates to an amine-free composition for cleaning post-CMP residue and contaminants, said first composition comprising at least one oxidizing agent, at least one complexing agent, at least one basic compound, at least one buffering agent, and water. Optionally, the first composition may further comprise at least one solvating agent, at least one surfactant, or a combination thereof. The components in the first composition are present in the following range of weight percents, based on the total weight of the composition,

| Component | weight percent | preferred wt. % |
|---|---|---|
| oxidizing agent(s) | about 0.01 wt % to about 10 wt % | about 0.1 wt % to about 1 wt % |
| complexing agent(s) | about 1 wt % to about 30 wt % | about 1 wt % to about 25 wt % |
| basic compound(s) | about 0.01 wt % to about 5 wt % | about 0.01 wt % to about 5 wt % |
| buffering agent(s) | about 0.01 wt % to about 10 wt % | about 0.1 wt % to about 5 wt % |
| water | about 42 wt % to about 99 wt % | about 66.5 wt % to about 95 wt % |
| optional surfactant(s) (when present) | about 0.001 wt % to about 2 wt % | about 0.001 wt % to about 1 wt % |
| optional solvating agent(s) (when present) | about 0.01 wt % to about 30 wt % | about 5 wt % to about 20 wt % |

Upon dilution, the weight percent values of the components in the concentrated first composition will change as a factor of the dilution factor, as readily understood by one skilled in the art.

In one embodiment, the first composition comprises, consists of, or consists essentially of at least one oxidizing agent, at least one complexing agent, at least one basic compound, at least one buffering agent, and water. In another embodiment, the first composition comprises, consists of, or consists essentially of at least one oxidizing agent, at least one complexing agent, at least one basic compound, at least one buffering agent, at least one solvating agent, and water. In still another embodiment, the first composition comprises, consists of, or consists essentially of at least one oxidizing agent, at least one complexing agent, at least one basic compound, at least one surfactant, at least one buffering agent, and water. In yet another embodiment, the first composition comprises, consists of, or consists essentially of at least one oxidizing agent, at least one complexing agent, at least one basic compound, at least one surfactant, at least one solvating agent, at least one buffering agent, and water. The water is preferably deionized. It should be appreciated that the at least one oxidizing agent can be added just upstream of or at the cleaning apparatus.

In the broad practice of the invention, the pH range of the first composition is in a range from about 2.5 to about 12. Depending on the nature of the surface to be cleaned, sometimes a slightly acidic first composition will be preferred, for example in a range from about 2.5 to 7, and other times a slightly basic first composition will be preferred, for example in a range from 7 to about 12.

The compositions described herein may have utility in applications including, but not limited to, post-etch residue removal, post-ash residue removal surface preparation, post-plating cleaning, post-CMP residue removal, copper seed etching/cleaning, through silicon via (TSV) cleaning, MEMS cleaning, and cobalt and cobalt alloy surface cleaning.

The basic compounds contemplated include alkali metal hydroxides, ammonium hydroxide, and combinations thereof, wherein the alkali metal hydroxides include KOH, CsOH, and combinations thereof. Preferably, the basic compound(s) for the first composition comprise KOH.

The complexing agents contemplated herein include organic acids, comprising at least one COOH group or carboxylate group in a salt thereof, including, but not limited to, lactic acid, maleic acid, ascorbic acid, malic acid, citric acid, benzoic acid, fumaric acid, succinic acid, oxalic acid, malonic acid, mandelic acid, maleic anhydride, phthalic acid, aspartic acid, glutamic acid, glutaric acid, glycolic acid, glyoxylic acid, phenylacetic acid, quinic acid, pyromellitic acid, tartaric acid, terephthalic acid, trimellitic acid, trimesic acid, gluconic acid, glyceric acid, formic acid, acetic acid, propionic acid, acrylic acid, adipic acid, itaconic acid, glucuronic acid, glycine, lysine, β-alanine, histidine, phenylalanine, cysteine, leucine, serine, 8-hydroxyquinoline, 2,4-pentanedione, benzetetracarboxylic acid, pyruvic acid, tannic acid, sulfanilic acid, 2-hydroxyphosphonocarboxylic acid (HPAA), pyrocatecol, pyrogallol, gallic acid, tannic acid, ethylenediamine tetraacetic acid (EDTA), diethylenetriaminepentaacetic acid (DTPA), (1,2-cyclohexylenedinitrilo)tetraacetic acid (CDTA), iminidiacetic acid, 2-phosphonobutane-1,2,4-tricarboxylic acid (PBTCA), other aliphatic and aromatic carboxylic acids, salts thereof as well as combinations of the foregoing acids. Other complexing agents contemplated, as an alternative or in addition to, include phosphonic acid and derivatives thereof (e.g., hydroxyethylidene diphosphonic acid (HEDP), 1-hydroxyethane-1,1-diphosphonic acid, nitrilo-tris(methylenephosphonic acid), salicylic acid, p-toluenesulfonic acid, sulfosalicylic acid and derivatives thereof, and any combination thereof. Preferably, the complexing agent for the first composition comprises citric acid, HEDP, sulfosalicylic acid, and any combination thereof.

Oxidizing agents contemplated include ozone, nitric acid, bubbled air, cyclohexylaminosulfonic acid, hydrogen peroxide ($H_2O_2$), $FeCl_3$ (both hydrated and unhydrated), oxone ($2KHSO_5 \cdot KHSO_4 \cdot K_2SO_4$), ammonium polyatomic salts (e.g., ammonium peroxomonosulfate, ammonium chlorite ($NH_4ClO_2$), ammonium chlorate ($NH_4ClO_3$), ammonium iodate ($NH_4IO_3$), ammonium perborate ($NH_4BO_3$), ammonium perchlorate ($NH_4ClO_4$), ammonium periodate ($NH_4IO_3$), ammonium persulfate (($NH_4)_2S_2O_8$), ammonium hypochlorite ($NH_4ClO$)), sodium perborate ($NaBO_3$), sodium polyatomic salts (e.g., sodium persulfate ($Na_2S_2O_8$), sodium hypochlorite (NaClO)), potassium polyatomic salts (e.g., potassium iodate ($KIO_3$), potassium permanganate ($KMnO_4$), potassium persulfate, potassium persulfate ($K_2S_2O_8$), potassium hypochlorite (KClO)), tetramethylammonium polyatomic salts (e.g., tetramethylammonium chlorite (($N(CH_3)_4)ClO_2$), tetramethylammonium chlorate (($N(CH_3)$ $_4$)ClO$_3$), tetramethylammonium iodate ((N(CH$_3$)$_4$)IO$_3$), tetramethylammonium perborate ((N(CH$_3$)$_4$)BO$_3$), tetramethylammonium perchlorate ((N(CH$_3$)$_4$)ClO$_4$), tetramethylammonium periodate ((N(CH$_3$)$_4$)IO$_4$), tetramethylammonium persulfate ((N(CH$_3$)$_4$)S$_2$O$_8$)), tetrabutylammonium polyatomic salts (e.g., tetrabutylammonium peroxomonosulfate), peroxomonosulfuric acid, ferric nitrate (Fe(NO$_3$)$_3$), amine-N-oxides (e.g., N-methylmorpholine-N-oxide (NMMO); trimethylamine-N-oxide; triethylamine-N-oxide; pyridine-N-oxide; N-ethylmorpholine-N-oxide; N-methylpyrrolidine-N-oxide; N-ethylpyrrolidine-N-oxide) urea hydrogen peroxide ((CO(NH$_2$)$_2$)H$_2$O$_2$), peracetic acid (CH$_3$(CO)OOH), periodic acid, potassium dichromate, potassium chlorate, 2-nitrophenol, 1,4-benzoquinone, peroxybenzoic acid, peroxyphthalic acid salts, vanadium oxides (e.g., VO$_2$, V$_6$O$_{13}$), ammonium metavanadate, ammonium tungstate, sodium nitrate, potassium nitrate, ammonium nitrate, strontium nitrate, sulfuric acid, and combinations thereof. Preferably, the oxidizing agent for the first composition comprises hydrogen peroxide, NMMO, urea hydrogen peroxide, and combinations thereof.

Buffering agents are added to stabilize the first composition during dilution and manufacturing as well as achieve the appropriate compositional pH, as readily determined by the skilled artisan. Buffering agents contemplated include, but are not limited to, dipotassium phosphate, potassium carbonate, boric acid, lysine, proline, β-alanine, ethylenediamine tetraacetic acid (EDTA), diethylenetriaminepentaacetic acid (DTPA), dimethyl glyoxime, dibasic phosphate salts (e.g., (NH$_4$)H$_2$PO$_4$, K$_2$HPO$_4$), tribasic phosphate salts (e.g., (NH$_4$)$_3$PO$_4$, K$_3$PO$_4$), mixtures of dibasic and tribasic phosphate salts (e.g., K$_2$HPO$_4$/K$_3$PO$_4$), mixures of dibasic and tribasic carbonate salts (e.g., K$_2$CO$_3$/KHCO$_3$), hydroxyethylidene diphosphonic acid (HEDP), and combinations thereof. Preferred buffering agents include dibasic phosphate salts (e.g., (NH$_4$)H$_2$PO$_4$, K$_2$HPO$_4$), tribasic phosphate salts (e.g., (NH$_4$)$_3$PO$_4$, K$_3$PO$_4$), mixtures of dibasic and tribasic phosphate salts (e.g., K$_2$HPO$_4$/K$_3$PO$_4$), HEDP, and combinations thereof.

When present, solvating agents contemplated include, but are not limited to, 2-pyrrolidinone, 1-(2-hydroxyethyl)-2-pyrrolidinone, glycerol, 1,4-butanediol, tetramethylene sulfone (sulfolane), dimethyl sulfone, ethylene glycol, propylene glycol, dipropylene glycol, diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether (i.e., butyl carbitol), triethylene glycol monobutyl ether, ethylene glycol monohexyl ether, diethylene glycol monohexyl ether, ethylene glycol phenyl ether, propylene glycol methyl ether, dipropylene glycol methyl ether (DPGME), tripropylene glycol methyl ether (TPGME), dipropylene glycol dimethyl ether, dipropylene glycol ethyl ether, propylene glycol n-propyl ether, dipropylene glycol n-propyl ether (DPGPE), tripropylene glycol n-propyl ether, propylene glycol n-butyl ether, dipropylene glycol n-butyl ether, tripropylene glycol n-butyl ether, propylene glycol phenyl ether, and combinations thereof. Preferably, when present, the solvating agent for the first composition comprises sulfolane (tetramethylene sulfone), 1-(2-hydroxyethyl)-2-pyrrolidinone, and combinations thereof.

When present, surfactants for use in the compositions described herein include, but are not limited to, amphoteric salts, cationic surfactants, anionic surfactants, zwitterionic surfactants, non-ionic surfactants, and combinations thereof including, but not limited to, decylphosphonic acid, dodecylphosphonic acid (DDPA), tetradecylphosphonic acid, hexadecylphosphonic acid, bis(2-ethylhexyl)phosphate, octadecylphosphonic acid, perfluoroheptanoic acid, prefluorodecanoic acid, trifluoromethanesulfonic acid, phosphonoacetic acid, dodecylbenzenesulfonic acid (DDBSA), other R$_1$ benzene sulfonic acids or salts thereof (where the R$_1$ is a straight-chained or branched C$_8$-C$_{18}$ alkyl group), dodecenylsuccinic acid, dioctadecyl hydrogen phosphate, octadecyl dihydrogen phosphate, dodecylamine, dodecenylsuccinic acid monodiethanol amide, lauric acid, palmitic acid, oleic acid, juniperic acid, 12 hydroxystearic acid, octadecylphosphonic acid (ODPA), dodecyl phosphate. Non-ionic surfactants contemplated include, but are not limited to, polyoxyethylene lauryl ether (Emalmin NL-100 (Sanyo), Brij 30, Brij 98, Brij 35), dodecenylsuccinic acid monodiethanol amide (DSDA, Sanyo), ethylenediamine tetrakis (ethoxylate-block-propoxylate) tetrol (Tetronic 90R4), polyethylene glycols (e.g., PEG400), polypropylene glycols, polyethylene or polypropylene glycol ethers, block copolymers based on ethylene oxide and propylene oxide (Newpole PE-68 (Sanyo), Pluronic L31, Pluronic 31R1, Pluronic L61, Pluronic F-127), polyoxypropylene sucrose ether (SN008S, Sanyo), t-octylphenoxypolyethoxyethanol (Triton X100), 10-ethoxy-9,9-dimethyldecan-1-amine (TRITON® CF-32), Polyoxyethylene (9) nonylphenylether, branched, Polyoxyethylene (40) nonylphenylether, branched (e.g., IGEPAL Co 890), dinonylphenyl polyoxyethylene, nonylphenol alkoxylates (e.g., SURFONIC LF-41), polyoxyethylene sorbitol hexaoleate, polyoxyethylene sorbitol tetraoleate, polyethylene glycol sorbitan monooleate (Tween 80), sorbitan monooleate (Span 80), a combination of Tween 80 and Span 80, alcohol alkoxylates (e.g., Plurafac RA-20), alkyl-polyglucoside, ethyl perfluorobutyrate, 1,1,3,3,5,5-hexamethyl-1,5-bis[2-(5-norbornen-2-yl)ethyl]trisiloxane, monomeric octadecylsilane derivatives such as SIS6952.0 (Siliclad, Gelest), siloxane modified polysilazane such as PP1-SG10 Siliclad Glide 10 (Gelest), silicone-polyether copolymers such as Silwet L-77 (Setre Chemical Company), Silwet ECO Spreader (Momentive), and ethoxylated fluorosurfactants (ZONYL® FSO, ZONYL® FSN-100). Cationic surfactants contemplated include, but are not limited to, cetyl trimethylammonium bromide (CTAB), heptadecanefluorooctane sulfonic acid, tetraethylammonium, stearyl trimethylammonium chloride (Econol TMS-28, Sanyo), 4-(4-diethylaminophenylazo)-1-(4-nitrobenzyl)pyridium bromide, cetylpyridinium chloride monohydrate, benzalkonium chloride, benzethonium chloride benzyldimethyldodecylammonium chloride, benzyldimethylhexadecylammonium chloride, hexadecyltrimethylammonium bromide, dimethyldioctadecylammonium chloride, dodecyltrimethylammonium chloride, hexadecyltrimethylammonium p-toluenesulfonate, didodecyldimethylammonium bromide, di(hydrogenated tallow)dimethylammonium chloride, tetraheptylammonium bromide, tetrakis(decyl)ammonium bromide, Aliquat® 336 and oxyphenonium bromide, guanidine hydrochloride (C(NH$_2$)$_3$Cl) or triflate salts such as tetrabutylammonium trifluoromethanesulfonate, dimethyldioctadecylammonium chloride, dimethyldihexadecylammonium bromide, di(hydrogenated tallow)dimethylammonium chloride (e.g., Arquad 2HT-75, Akzo Nobel), and polyoxyethylene (16) tallow ethylmonium ethosulfate (e.g., CRODAQUAT TES). Anionic surfactants contemplated include, but are not limited to, poly(acrylic acid sodium salt), ammonium polyacrylate (e.g., DARVAN 821A), sodium polyoxyethylene lauryl ether, sodium dihexylsulfosuccinate, sodium dodecyl sulfate, dioctylsulfosuccinate salt, 2-sulfosuccinate salts, 2,3-dimercapto-1-propanesulfonic acid salt, dicyclohexyl sulfosuccinate sodium salt, sodium 7-ethyl-2-methyl-4-undecyl sulfate (Tergitol 4), SODOSIL RM02, phosphate fluorosurfactants such as Zonyl FSJ and ZONYL® UR, fluorosurfactants such as NOVEC 4300, and polyacrylates such as SOKALAN CP10S. Zwitterionic surfactants include, but are not limited to, acetylenic diols or modified acetylenic diols (e.g., SUR-FONYL® 504), ethylene oxide alkylamines (AOA-8, Sanyo), N,N-dimethyldodecylamine N-oxide, sodium cocaminpropinate (LebonApl-D, Sanyo), 3-(N,N-dimethyl-myristylammonio)propanesulfonate, and (3-(4-heptyl)phenyl-3-hydroxypropyl)dimethylammoniopropanesulfonate. Preferably, the at least one surfactant for the composition of the first aspect comprises dodecylbenzene sulfonic acid, PEG400, ZONYL FSO, Tween 80, SURFONIC LF-41, IGEPAL Co 890, DARVAN 821A, NOVEC 4300, CRODAQUAT TES, PLURONIC F-127, SOKALAN CP1OS, and combinations thereof.

The first compositions described herein are preferably substantially devoid of abrasive material typically used in chemical mechanical polishing processes (before the initiation of cleaning), fluoride-containing sources, amines, quaternary ammonium bases, and any combination thereof. Quaternary ammonium bases include compounds having the formula $NR^1R^2R^3R^4OH$, wherein $R^1$, $R^2$, $R^3$ and $R^4$ may be the same as or different from one another and are selected from the group consisting of hydrogen, straight-chained or branched $C_1$-$C_6$ alkyl (e.g., methyl, ethyl, propyl, butyl, pentyl, and hexyl), and substituted or unsubstituted $C_6$-$C_{10}$ aryl, e.g., benzyl, with the proviso at least one of $R^1$, $R^2$, $R^3$ or $R^4$ has to be a component other than hydrogen.

The first composition can further include cleaning additives such as polyelectrolytes (e.g., polyacrylic acid, poly (acrylic-co-maleic acid), 1,2,4-triazole and derivatives thereof), copper ion sources, and combinations thereof.

In a preferred embodiment, the first composition comprises, consists of, or consists essentially of urea hydrogen peroxide, citric acid, KOH, at least one surfactant, at least one buffering agent, and water. In still another preferred embodiment, the first composition comprises, consists of, or consists essentially of urea hydrogen peroxide, citric acid, KOH, at least one surfactant, at least one buffering agent, sulfolane, and water. In another preferred embodiment, the first composition comprises, consists of, or consists essentially of (i) at least one oxidizing agent comprising a species selected from the group consisting of hydrogen peroxide, urea hydrogen peroxide, NMMO, and combinations thereof, (ii) at least one basic compound comprising KOH, (iii) at least one solvating agent selected from the group consisting of sulfolane, 1-(2-hydroxyethyl)-2-pyrrolidinone, and combinations thereof, (iv) at least one buffering agent comprising a dibasic phosphate salt, (v) at least one complexing agent comprising a species selected from the group consisting of 5-sulfosalicylic acid and derivatives thereof, HEDP, and combinations thereof, (iv) and water, wherein the composition is substantially devoid of amines, quaternary bases, fluoride-containing sources, and abrasive material typically used in chemical mechanical polishing processes, wherein the pH is in a range from about 7 to about 12. Preferably, the first composition has a copper etch rate less than 5 Å $min^{-1}$ and a BTA removal efficiency greater than 20%, more preferably greater than 30%, and most preferably greater than 40%.

In one embodiment of the first aspect, a concentrated first composition is provided that can be diluted for use as a cleaning solution. A concentrated composition, or "concentrate," advantageously permits a user, e.g. CMP process engineer, to dilute the concentrate to the desired strength and acidity at the point of use. Dilution of the concentrated first composition may be in a range from about 1:1 to about 2500:1, wherein the first composition is diluted at or just before the tool with solvent, e.g., deionized water.

An important feature of the first composition described herein is that the non-aqueous constituents (the constituents other than water) are present in the composition in small quantities, often less than about 20% by weight. This is an economic advantage since an effective first composition can be formulated more economically, which is of importance since post-CMP first compositions are used in large quantities. Furthermore, because the first composition is water-based, the first compositions described herein are more easily disposed of. Notably, the life of the first composition is dependent only on particle loading and as such, the first composition is recyclable.

In yet another preferred embodiment, the first compositions described herein comprise, consist of, or consist essentially of at least one oxidizing agent, at least one complexing agent, at least one basic compound, at least one buffering agent, optionally at least one surfactant, optionally at least one solvating agent, water, residue and/or contaminants. Importantly, the residue and contaminants may be dissolved and/or suspended in the first composition described herein. Preferably, the residue includes post-CMP residue.

The first compositions described herein are easily formulated by simple addition of the respective ingredients and mixing to homogeneous condition. Furthermore, the first compositions may be readily formulated as single-package formulations or multi-part formulations that are mixed at or before the point of use, e.g., the individual parts of the multi-part formulation may be mixed at the tool or in a storage tank upstream of the tool. The concentrations of the respective ingredients may be widely varied in specific multiples of the first composition, i.e., more dilute or more concentrated, in the broad practice of the invention, and it will be appreciated that the first compositions can variously and alternatively comprise, consist or consist essentially of any combination of ingredients consistent with the disclosure herein.

Accordingly, another aspect relates to a kit including, in one or more containers, one or more components adapted to form the compositions of the first aspect of the invention. Preferably, the kit includes, in one or more containers, at least one complexing agent, at least one basic compound, at least one buffering agent, optionally at least one surfactant, optionally at least one solvating agent, and water, for combining with additional water, at least one oxidizing agent, or both, at the fab or the point of use. The containers of the kit must be suitable for storing and shipping said first composition components, for example, NOWPak® containers (Advanced Technology Materials, Inc., Danbury, Conn., USA).

In a second aspect, the present invention relates to an acidic, amine-free composition for cleaning post-CMP residue and contaminants, said second composition comprising at least one complexing agent, at least one sulfonic acid-containing hydrocarbon, at least one basic compound, and water. Optionally, the second composition may further comprise at least one dispersing agent, at least one surfactant, at least one oxidizing agent, or any combination thereof. The components in the second composition are present in the following range of weight percents, based on the total weight of the composition,

| component | weight percent | preferred wt. % |
|---|---|---|
| complexing agent(s) | about 1 wt % to about 30 wt % | about 5 wt % to about 25 wt % |
| sulfonic acid-containing hydrocarbon(s) | about 0.1 wt % to about 5 wt % | about 0.5 wt % to about 2.5 wt % |
| basic compound(s) | less than about 5 wt % | less than about 5 wt % |
| water | about 42 wt % to about 99 wt % | about 66 wt % to about 95 wt % |
| optional dispersing agent(s) (when present) | about 0.01 wt % to about 2 wt % | about 0.1 wt % to about 1 wt % |
| optional surfactant(s) (when present) | about 0.001 wt % to about 1 wt % | about 0.001 wt % to about 0.5 wt % |
| optional oxidizing agent(s) (when present) | about 0.01 wt % to about 10 wt % | about 0.1 wt % to about 1 wt % |

Upon dilution, the weight percent values of the components in the concentrated second composition will change as a factor of the dilution factor, as readily understood by one skilled in the art.

In one embodiment, the second composition comprises, consists of, or consists essentially of at least one complexing agent, at least one sulfonic acid-containing hydrocarbon, at least one basic compound, and water. In another embodiment, the second composition comprises, consists of, or consists essentially of at least one complexing agent, at least one sulfonic acid-containing hydrocarbon, at least one dispersing agent, at least one basic compound, and water. In yet another embodiment, the second composition comprises, consists of, or consists essentially of at least one complexing agent, at least one sulfonic acid-containing hydrocarbon, at least one basic compound, at least one surfactant, and water. In still another embodiment, the second composition comprises, consists of, or consists essentially of at least one complexing agent, at least one sulfonic acid-containing hydrocarbon, at least one basic compound, at least one surfactant, at least one dispersing agent, and water. In another embodiment, the second composition comprises, consists of, or consists essentially of at least one complexing agent, at least one sulfonic acid-containing hydrocarbon, at least one dispersing agent, at least one basic compound, at least one oxidizing agent, and water. The water is preferably deionized. Preferably, KOH is used as the basic compound.

In the broad practice of the invention, the pH range of the second composition is less than about 7.0, more preferably less than 4.5, still more preferably in a range from about 1 to about 4, and most preferably in a range from about 2 to about 3.

The second compositions described herein may have utility in applications including, but not limited to, post-etch residue removal, post-ash residue removal surface preparation, post-plating cleaning, post-CMP residue removal, copper seed etching/cleaning, through silicon via (TSV) cleaning, MEMS cleaning, and cobalt and cobalt alloy surface cleaning.

Illustrative surfactants for use in the compositions described herein include, but are not limited to, amphoteric salts, cationic surfactants, anionic surfactants, zwitterionic surfactants, non-ionic surfactants, and combinations thereof, as introduced herein for the first composition. Preferably, the at least one surfactant of the second composition comprises dodecylbenzene sulfonic acid, dodecyl phosphonic acid, and dodecyl phosphate.

The basic compounds contemplated include alkali metal hydroxides, ammonium hydroxide, and combinations thereof, wherein the alkali metal hydroxides include KOH, CsOH, and combinations thereof. Preferably, the basic compound(s) of the second composition comprise KOH.

The dispersing agent used in the second composition described herein is included to increase dispersancy and minimize redeposition of the removed residue and contaminants at the surface of the microelectronic device wafer. Dispersing agents contemplated herein include organic polymers containing acrylic acid or its salts having an average molecular weight of less than 15,000, hereinafter referred to as low molecular weight acrylic acid-containing polymer. The low molecular weight acrylic acid-containing polymer has an average molecular weight of less than 15,000, preferably from about 3,000 to about 10,000. The low molecular weight acrylic acid-containing polymer may be either a homopolymer or a copolymer including the essential acrylic acid or acrylic acid salt monomer units. Copolymers may include essentially any suitable other monomer units including modified acrylic, fumaric, maleic, itaconic, aconitic, mesaconic, citraconic, and methylenemalonic acid or their salts, maleic anhydride, alkylene, vinylmethyl ether, styrene and any mixtures thereof. Preferred dispersing agents include poly(acrylic) acids such as commercially available low molecular weight acrylic acid containing homopolymers include those sold under the tradename Acusol 445 (Rohm and Haas, Philadelphia, Pa., USA) or Sokalon.

The sulfonic acid-containing hydrocarbons contemplated herein include straight chain and branched $C_1$-$C_6$ alkane, e.g., methane, ethane, propane, butane, pentane, hexane, sulfonic acids, straight chain and branched $C_2$-$C_6$ alkene, e.g., ethane, propene, butane, pentene, hexane, sulfonic acids, and substituted or unsubstituted $C_6$-$C_{14}$ aryl sulfonic acids, and salts thereof, e.g., sodium, potassium, etc. Sulfonic acid-containing hydrocarbons include methanesulfonic acid (MSA), ethanesulfonic acid, propanesulfonic acid, butanesulfonic acid, pentanesulfonic acid, hexanesulfonic acid, ethenesulfonic acid, toluenesulfonic acid, and combinations thereof. Most preferably, the sulfonic-acid containing hydrocarbon comprises MSA.

The complexing agents contemplated herein include species introduced hereinabove for the first composition. Preferably, the complexing agent for the second composition comprises citric acid.

The oxidizing agents contemplated herein include species introduced hereinabove for the first composition. Preferably, the oxidizing agent comprises hydrogen peroxide or urea hydrogen peroxide.

The second compositions of the invention are preferably substantially devoid of abrasive material typically used in chemical mechanical polishing processes (before the initiation of cleaning), fluoride-containing sources, amines, quaternary ammonium bases, and any combination thereof. Quaternary ammonium bases include compounds having the formula $NR^1R^2R^3R^4OH$, wherein $R^1$, $R^2$, $R^3$ and $R^4$ may be the same as or different from one another and are selected from the group consisting of hydrogen, straight-chained or branched $C_1$-$C_6$ alkyl (e.g., methyl, ethyl, propyl, butyl, pentyl, and hexyl), and substituted or unsubstituted $C_6$-$C_{10}$ aryl, e.g., benzyl, with the proviso at least one of $R^1$, $R^2$, $R^3$ or $R^4$ has to be a component other than hydrogen.

The second composition can further include cleaning additives such as polyelectrolytes (e.g., polyacrylic acid, poly(acrylic-co-maleic acid), 1,2,4-triazole and derivatives thereof), buffering agents, solvating agents, copper ion sources, and combinations thereof.

In a preferred embodiment, the second composition comprises, consists of, or consists essentially of methanesulfonic acid, citric acid, KOH and water. In still another preferred embodiment, the second composition comprises, consists of, or consists essentially of methanesulfonic acid, citric acid, KOH, hydrogen peroxide, and water.

The second composition may be formulated in the following formulations, wherein the active ingredients in the formulations are at the following weight percents, based on the total weight of the composition, with the balance being water:

| Formulation | wt % complexing agent | wt % sulfonic-acid cont. hydrocarbon | wt % surfactant | wt % dispersing agent | wt % KOH |
|---|---|---|---|---|---|
| A | 15 | 1.5 | 0.2 | 0.44 | |
| B | 5 | 0.5 | | | <5 |
| C | 5 | 2.5 | | | <5 |
| D | 25 | 0.5 | | | <5 |
| E | 25 | 2.5 | | | <5 |
| F | 15 | 1.5 | | | <5 |
| G | 15 | 0.5 | 0.2 | | <5 |
| H | 25 | 2.5 | | 0.44 | <5 |
| I | 15 | 0.5 | 0.2 | 0.44 | <5 |

In one embodiment, a concentrated second composition is provided that can be diluted for use as a cleaning solution. A concentrated second composition, or "concentrate," advantageously permits a user, e.g. CMP process engineer, to dilute the concentrate to the desired strength and acidity at the point of use. Dilution of the concentrated second composition may be in a range from about 1:1 to about 2500:1, wherein the second composition is diluted at or just before the tool with solvent, e.g., deionized water. It is to be appreciated by one skilled in the art that following dilution, the range of weight percent ratios of the components disclosed herein should remain unchanged.

An important feature of the second composition described herein is that the non-aqueous constituents (the constituents other than water) are present in the composition in small quantities, often less than about 10% by weight. This is an economic advantage since an effective second composition can be formulated more economically, which is of importance since post-CMP second compositions are used in large quantities. Furthermore, because the second composition is water-based, the second compositions of the invention are more easily disposed of. Notably, the life of the second composition is dependent only on particle loading and as such, the second composition is recyclable.

In yet another preferred embodiment, the second compositions described herein comprise, consist of, or consist essentially of at least one complexing agent, at least one sulfonic acid-containing hydrocarbon, at least one basic compound, water, residue and/or contaminants, optionally at least one dispersing agent, optionally at least one surfactant, and optionally at least one oxidizing agent. Importantly, the residue and contaminants may be dissolved and/or suspended in the second composition described herein. Preferably, the residue includes post-CMP residue.

According to the Merck Index, methanesulfonic acid is corrosive to copper (Merck Index, 11$^{th}$ ed., 1989, pg 938). Surprisingly, the second compositions described herein comprising methanesulfonic acid do not readily corrode exposed copper, aluminum and/or tungsten interconnect material. Furthermore, the dielectric material, including low-k dielectric material such as TEOS, BLACK DIAMOND™, and other ultra low-k dielectric materials, on the microelectronic device is not compromised by the second compositions of the invention. Moreover, unexpectedly, the inclusion of the basic compounds to the second composition to create a composition having a pH in a range from about 1 to about 4, and more preferably in a range from about 2 to about 3, resulted in a composition having increased BTA removal efficiency and a lower copper etch rate.

The second compositions described herein are easily formulated by simple addition of the respective ingredients and mixing to homogeneous condition. Furthermore, the second compositions may be readily formulated as single-package formulations or multi-part formulations that are mixed at or before the point of use, e.g., the individual parts of the multi-part formulation may be mixed at the tool or in a storage tank upstream of the tool. The concentrations of the respective ingredients may be widely varied in specific multiples of the second composition, i.e., more dilute or more concentrated, in the broad practice of the invention, and it will be appreciated that the second compositions can variously and alternatively comprise, consist or consist essentially of any combination of ingredients consistent with the disclosure herein.

Accordingly, another aspect relates to a kit including, in one or more containers, one or more components adapted to form the compositions of the invention. Preferably, the kit includes, in one or more containers, at least one complexing agent, at least one sulfonic acid-containing hydrocarbon, at least one basic compound, water, optionally at least one dispersing agent, and optionally at least one surfactant, for combining with additional water and/or at least one oxidizing agent (when present) at the fab or the point of use. The containers of the kit must be suitable for storing and shipping said second composition components, for example, NOWPak® containers (Advanced Technology Materials, Inc., Danbury, Conn., USA).

In a third aspect, the amine-free first and second compositions are usefully employed to clean post-CMP residue and contaminants from the surface of the microelectronic device. Importantly, the amine-free first and second compositions do not damage low-k dielectric materials or substantially corrode metal interconnects, e.g., copper, on the device surface. Preferably the amine-free first and second compositions remove at least 85% of the residue present on the device prior to residue removal, more preferably at least 90%, even more preferably at least 95%, and most preferably at least 99%.

In post-CMP residue and contaminant cleaning application, the amine-free first or second compositions may be used with a large variety of conventional cleaning tools such as megasonics and brush scrubbing, including, but not limited to, Verteq single wafer megasonic Goldfinger, OnTrak systems DDS (double-sided scrubbers), SEZ single wafer spray rinse, Applied Materials Mirra-Mesa™/Reflexion™/Reflexion LK™, and Megasonic batch wet bench systems.

In use of the amine-free first or second compositions for cleaning post-CMP residue and contaminants from microelectronic devices having same thereon, the amine-free first or second composition typically is contacted with the device for a time of from about 5 sec to about 10 minutes, preferably about 15 sec to 5 min, at temperature in a range of from about 20° C. to about 50° C. Such contacting times and temperatures are illustrative, and any other suitable time and temperature conditions may be employed that are efficacious to at least partially clean the post-CMP residue/contaminants from the device. "At least partially clean" and "substantial removal" both correspond to at removal of at least 85% of the residue present on the device prior to residue removal, more preferably at least 90%, even more preferably at least 95%, and most preferred at least 99%

Following the achievement of the desired cleaning action, the amine-free first or second composition may be readily removed from the device to which it has previously been applied, as may be desired and efficacious in a given end use application of the compositions of the present invention. Preferably, the rinse solution includes deionized water. Thereafter, the device may be dried using nitrogen or a spin-thy cycle.

Yet another aspect relates to the improved microelectronic devices made according to the methods described herein and to products containing such microelectronic devices.

Another aspect relates to a recycled first or second composition. The first or second composition may be reused until residue and/or contaminant loading reaches the maximum amount the respective composition may accommodate, as readily determined by one skilled in the art.

A still further aspect relates to methods of manufacturing an article comprising a microelectronic device, said method comprising contacting the microelectronic device with an first or second composition for sufficient time to clean post-CMP residue and contaminants from the microelectronic device having said residue and contaminants thereon, and incorporating said microelectronic device into said article.

EXAMPLE 1

The efficacy of formulations A-I for removing BTA from a device surface as well as the copper etch rate and roughness was evaluated. Each formulation was diluted 30:1 with DI water. The device was a copper coupon that was pretreated with citric acid for 5 minutes to remove the native oxide. Thereafter, the coupon was immersed in a 1 wt % BTA solution for 5 minutes and rinsed with DI water. The wafer was immersed in each specific formulation at room temperature with 400 rpm agitation, followed by a deionized water rinse and a $N_2$ dry. Metrology was performed using a pre and post grazing angle-FTIR.

The results of the experiments are provided in Table 1.

TABLE 1

BTA removal efficiency, copper etch rate and copper surface roughness.

| Formulation | BTA Removal Efficiency % (10 min processing) | Cu etch rate/Å $min^{-1}$ | Cu roughness/nm |
|---|---|---|---|
| A | 59.28 | 1.98 ± 0.08 | 2.35 ± 0.22 |
| B | 51.23 | 0.91 ± 0.04 | 3.07 ± 0.35 |
| C | 71.74 | 0.91 ± 0.10 | 3.29 ± 0.04 |
| D | 72.64 | 0.80 ± 0.12 | 3.21 ± 0.65 |
| E | 82.32 | 0.81 ± 0.07 | 3.36 ± 0.42 |
| F | 66.98 | 1.03 ± 0.13 | 2.15 ± 0.65 |
| G | 40.47 | 1.13 ± 0.15 | 1.85 ± 0.62 |
| H | 51.61 | 0.94 ± 0.06 | 2.83 ± 0.20 |
| I | 34.25 | 1.08 ± 0.10 | 1.64 ± 0.35 |

It can be seen that the formulations comprising citric acid, MSA and KOH efficiently removed the BTA and displayed a very low copper etch rate.

EXAMPLE 2

Compositions having the following ranges were prepared and the efficiency of BTA removal as well as the copper etch rate and the copper roughness determined.

Formulation AA: 3.5 wt % $KH_2PO_4$, 19.36 wt % N-(2-hydroxyethyl)-2-pyrrolidone, 4 wt % HEDP (60%), KOH to bring the pH to 10.5, balance water Formulations BB: 0.2-0.9 wt % urea $H_2O_2$, 1-5 wt % $KH_2PO_4$, 15-35 wt % N-(2-hydroxyethyl)-2-pyrrolidone, 2-15 wt % HEDP (60%), KOH to bring the pH to 10.5-11.5, balance water Formulations CC: 0.2-0.9 wt % urea $H_2O_2$, 0.01-0.1 wt % NMMO (47%), 1-5 wt % $KH_2PO_4$, 15-35 wt % N-(2-hydroxyethyl)-2-pyrrolidone, 2-15 wt % HEDP (60%), KOH to bring the pH to 10.5-11.5, balance water Formulations DD: 0.2-0.9 wt % $H_2O_2$, 1-5 wt % $KH_2PO_4$, 15-35 wt % N-(2-hydroxyethyl)-2-pyrrolidone, 2-15 wt % HEDP (60%), KOH to bring the pH to 10.5-11.5, balance water Formulations EE: 0.2-0.9 wt % $H_2O_2$, 0.01-0.1 wt % NMMO (47%), 1-5 wt % $KH_2PO_4$, 15-35 wt % N-(2-hydroxyethyl)-2-pyrrolidone, 2-15 wt % HEDP (60%), KOH to bring the pH to 10.5-11.5, balance water Formulations FF: 0.2-0.9 wt % urea $H_2O_2$, 0.01-0.1 wt % NMMO (47%), 1-5 wt % $KH_2PO_4$, 10-20 wt % sulfolane, 2-8 wt % 5-sulfosalicylic acid, KOH to bring the pH to 10.5-11.5, balance water Formulations GG: 0.2-0.9 wt % urea $H_2O_2$, 1-5 wt % $KH_2PO_4$, 10-20 wt % sulfolane, 2-8 wt % 5-sulfosalicylic acid, KOH to bring the pH to 10.5-11.5, balance water Formulations HH: 0.2-0.9 wt % urea $H_2O_2$, 1-5 wt % $KH_2PO_4$, 10-20 wt % sulfolane, 2-8 wt % citric acid, KOH to bring the pH to 10.5-11.5, balance water The efficiency of BTA removal for formulation AA was 7.14% while the copper etch rate was 0.89 Å $min^{-1}$ (s.d. 0.10) and the copper roughness was 0.81 nm (s.d. 0.03). In contrast, formulations satisfying the ranges disclosed in BB-HH had BTA removal efficiencies greater than 20%, in some cases greater than 30%, and a copper etch rate of less than 5 Å $min^{-1}$. With many of the formulations, the copper roughness decreased.

Although the invention has been variously disclosed herein with reference to illustrative embodiments and features, it will be appreciated that the embodiments and features described hereinabove are not intended to limit the invention, and that other variations, modifications and other embodiments will suggest themselves to those of ordinary skill in the art, based on the disclosure herein. The invention therefore is to be broadly construed, as encompassing all such variations, modifications and alternative embodiments within the spirit and scope of the claims hereafter set forth.

What is claimed is:

1. A composition comprising at least one oxidizing agent in an amount ranging from about 0.1 wt % to about 1 wt %, at least one complexing agent in an amount ranging from about 1 wt % to about 25 wt %, at least one basic compound in an amount ranging from about 0.01 wt % to about 5 wt %, at least one buffering agent in an amount ranging from about 0.1 wt % to about 5 wt %, and water in an amount ranging from about 66.5 wt % to about 95 wt %, wherein
the composition is substantially devoid of amines, quaternary bases, and fluoride-containing sources, and is free of abrasive material;
a pH of the composition is in a range of from about 10.5 to about 12;
the at least one complexing agent comprises a species selected from the group consisting of ascorbic acid, citric acid, benzoic acid, mandelic acid, maleic anhydride, aspartic acid, glutamic acid, glyoxylic acid, phenylacetic acid, quinic acid, terephthalic acid, trimellitic acid, trimesic acid, glyceric acid, propionic acid, acrylic acid, adipic acid, itaconic acid, glucuronic acid, lysine, histidine, phenylalanine, cysteine, leucine, serine, 8-hydroxyquinoline, 2,4-pentanedione, benzetetracarboxylic acid, pyruvic acid, sulfanilic acid, 2-hydroxyphosphonocarboxylic acid (HPAA), pyrocatechol, pyrogallol, (1,2-cyclohexylenedinitrilo) tetraacetic acid (CDTA), 2-phosphonobutane-1,2,4-tricarboxylic acid (PBTCA), phosphonic acid, hydroxyethylidene diphosphonic acid (HEDP), nitrilo-tris (methylenephosphonic acid), p-toluenesulfonic acid, sulfosalicylic acid and derivatives thereof, and any combination thereof; and wherein the composition at least partially removes residue and contaminants formed on the surface of the microelectronic device during a chemical mechanical polishing process step when in contact with the surface of the microelectronic device, the composition removing the residue and contaminants from the surface of the microelectronic device without damaging low-k dielectric materials, interconnect materials and via materials.

2. The composition of claim 1, wherein the at least one complexing agent comprises sulfosalicylic acid or derivatives thereof.

3. The composition of claim 1, wherein the at least one basic compound comprise a species selected from the group consisting of KOH, CsOH, ammonium hydroxide, and combinations thereof.

4. The composition of claim 1, wherein the at least one basic compound comprises KOH.

5. The composition of claim 1, wherein the at least one complexing agent further comprises a species selected from the group consisting of lactic acid, maleic acid, malic acid, citric acid, fumaric acid, succinic acid, oxalic acid, malonic acid, phthalic acid, glutaric acid, glycolic acid, pyromellitic acid, tartaric acid, gluconic acid, formic acid, acetic acid, glycine, β-alanine, gallic acid, tannic acid, ethylenediamine tetraacetic acid (EDTA), diethylenetriaminepentaacetic acid (DTPA), hydroxyethylidene diphosphonic acid (HEDP),-p-toluenesulfonic acid, and any combination thereof.

6. The composition of claim 1, wherein the at least one oxidizing agent comprises a species selected from the group consisting of ozone, nitric acid, bubbled air, cyclohexylaminosulfonic acid, hydrogen peroxide, $FeCl_3$, oxone ($2KHSO_5 \cdot KHSO_4 \cdot K_2SO_4$), ammonium peroxomonosulfate, ammonium chlorite, ammonium chlorate, ammonium iodate, ammonium perborate, ammonium perchlorate, ammonium periodate, ammonium persulfate, ammonium hypochlorite, sodium perborate, sodium persulfate, sodium hypochlorite, potassium iodate, potassium permanganate, potassium persulfate, potassium persulfate, potassium hypochlorite, tetramethylammonium chlorite, tetramethylammonium chlorate, tetramethylammonium iodate, tetramethylammonium perborate, tetramethylammonium perchlorate, tetramethylammonium periodate, tetramethylammonium persulfate, tetrabutylammonium peroxomonosulfate, peroxomonosulfuric acid, ferric nitrate, N-methylmorpholine-N-oxide, trimethylamine-N-oxide, triethylamine-N-oxide, pyridine-N-oxide, N-ethylmorpholine-N-oxide, N-methylpyrrolidine-N-oxide, N-ethylpyrrolidine-N-oxide, urea hydrogen peroxide, peracetic acid, periodic acid, potassium dichromate, potassium chlorate, 2-nitrophenol, 1,4-benzoquinone, peroxybenzoic acid, peroxyphthalic acid salts, vanadium oxides, ammonium metavanadate, ammonium tungstate, sodium nitrate, potassium nitrate, ammonium nitrate, strontium nitrate, sulfuric acid, and combinations thereof.

7. The composition of claim 1, wherein the at least one oxidizing agent comprises a species selected from the group consisting of hydrogen peroxide, N-methylmorpholine-N-oxide, urea hydrogen peroxide, and combinations thereof.

8. The composition of claim 1, wherein the at least one buffering agent comprises a species selected from the group consisting of dipotassium phosphate, potassium carbonate, boric acid, lysine, proline, β-alanine, ethylenediamine tetraacetic acid (EDTA), diethylenetriaminepentaacetic acid (DTPA), dimethyl glyoxime, dibasic phosphate ($K_2HPO_4$), tribasic phosphate ($K_3PO_4$), mixtures of dibasic and tribasic phosphate, mixures of dibasic and tribasic carbonate, hydroxyethylidene diphosphonic acid, and combinations thereof.

9. The composition of claim 1, wherein the at least one buffering agent comprises a species selected from the group consisting of dibasic phosphate ($K_2HPO_4$), tribasic phosphate ($K_3PO_4$), mixtures of dibasic and tribasic phosphate, HEDP, and combinations thereof.

10. The composition of claim 1, further comprising at least one solvating agent comprising a species selected from the group consisting of 2-pyrrolidinone, 1-(2-hydroxyethyl)-2-pyrrolidinone, glycerol, 1,4-butanediol, tetramethylene sulfone (sulfolane), dimethyl sulfone, ethylene glycol, propylene glycol, dipropylene glycol, diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether, triethylene glycol monobutyl ether, ethylene glycol monohexyl ether, diethylene glycol monohexyl ether, ethylene glycol phenyl ether, propylene glycol methyl ether, dipropylene glycol methyl ether (DPGME), tripropylene glycol methyl ether (TPGME), dipropylene glycol dimethyl ether, dipropylene glycol ethyl ether, propylene glycol n-propyl ether, dipropylene glycol n-propyl ether (DPGPE), tripropylene glycol n-propyl ether, propylene glycol n-butyl ether, dipropylene glycol n-butyl ether, tripropylene glycol n-butyl ether, propylene glycol phenyl ether, and combinations thereof.

11. The composition of claim 1, further comprising at least one solvating agent selected from the group consisting of sulfolane, 1-(2-hydroxyethyl)-2-pyrrolidinone, and combinations thereof.

12. The composition of claim 10, wherein the amount of at least one solvating agent is about 5 wt % to about 20 wt %, based on the total weight of the composition.

13. The composition of claim 1, further comprising at least one surfactant selected from the group consisting of dodecylbenzenesulfonic acid (DDBSA), polyethylene glycols, polypropylene glycols, polyethylene or polypropylene glycol ethers, block copolymers based on ethylene oxide and propylene oxide, polyoxyethylene (40) nonylphenylether (branched), dinonylphenyl polyoxyethylene, nonylphenol alkoxylates, polyethylene glycol sorbitan monooleate, sorbitan monooleate, ethoxylated fluorosurfactants, polyoxyethylene (16) tallow ethylmonium ethosulfate, ammonium polyacrylate, fluorosurfactants, polyacrylates, and combinations thereof.

14. The composition of claim 13, wherein the amount of the at least one surfactant is about 0.001 wt % to about 1 wt %, based on the total weight of the composition.

15. The composition of claim 1, wherein the composition comprises urea hydrogen peroxide, KOH, $KH_2PO_4$, 5-sulfosalicylic acid, at least one solvating agent, and water.

16. A method comprising: contacting a microelectronic device with a cleaning composition after a chemical mechanical polishing process step, the microelectronic device having residue and contaminants thereon resulting from the chemical mechanical polishing process step, wherein the microelectronic device is contacted with the cleaning composition for sufficient time to at least partially clean said residue and contaminants from the microelectronic device, and wherein the composition comprises at least one oxidizing agent in an amount ranging from about 0.1 wt % to about 1 wt %, at least one complexing agent in an amount ranging from about 1 wt % to about 25 wt %, at least one basic compound in an amount ranging from about 0.01 wt % to about 5 wt %, at least one buffering agent in an amount ranging from about 0.1 wt % to about 5 wt %, and water in an amount ranging from about 66.5 wt % to about 95 wt %, the composition is substantially devoid of amines, quaternary bases, and fluoride-containing sources, and is free of abrasive, a pH of the composition is in a range of from about 10.5 to about 12, and the at least one complexing agent comprises a species selected from the group consisting of ascorbic acid, citric acid, benzoic acid, mandelic acid, maleic anhydride, aspartic acid, glutamic acid, glyoxylic acid, phenylacetic acid, quinic acid, terephthalic acid, trimellitic acid, trimesic acid, glyceric acid, propionic acid, acrylic acid, adipic acid, itaconic acid, glucuronic acid, lysine, histidine, phenylalanine, cysteine, leucine, serine, 8-hydroxyquinoline, 2,4-pentanedione, benzetetracarboxylic acid, pyruvic acid, tannic acid, sulfanilic acid, 2-hydroxyphosphonocarboxylic acid (HPAA), pyrocatechol, pyrogallol, (1,2-cyclohexylenedinitrilo) tetraacetic acid (CDTA), 2-phosphonobutane-1,2,4-tricarboxylic acid) (PBTCA), phosphonic acid, hydroxyethylidene diphosphonic acid (HEDP), nitrilo-tris (methylenephosphonic acid, p-toluenesulfonic acid, sulfosalicylic acid and derivatives thereof, and any combination thereof.

17. The method of claim 16, wherein said residue and contaminants comprise post-CMP residue and contaminants.

18. The method of claim 16, wherein the at least one basic compound comprise a species selected from the group consisting of KOH, CsOH, ammonium hydroxide, and combinations thereof.

19. The method of claim 16, wherein the at least one oxidizing agent comprises a species selected from the group consisting of ozone, nitric acid, bubbled air, cyclohexylaminosulfonic acid, hydrogen peroxide, $FeCl_3$, oxone ($2KHSO_5 \cdot KHSO_4 \cdot K_2SO_4$), ammonium peroxomonosulfate, ammonium chlorite, ammonium chlorate, ammonium iodate, ammonium perborate, ammonium perchlorate, ammonium periodate, ammonium persulfate, ammonium hypochlorite, sodium perborate, sodium persulfate, sodium hypochlorite, potassium iodate, potassium permanganate, potassium persulfate, potassium persulfate, potassium hypochlorite, tetramethylammonium chlorite, tetramethylammonium chlorate, tetramethylammonium iodate, tetramethylammonium perborate, tetramethylammonium perchlorate, tetramethylammonium periodate, tetramethylammonium persulfate, tetrabutylammonium peroxomonosulfate, peroxomonosulfuric acid, ferric nitrate, N-methylmorpholine-N-oxide, trimethylamine-N-oxide, triethylamine-N-oxide, pyridine-N-oxide, N-ethylmorpholine-N-oxide, N-methylpyrrolidine-N-oxide, N-ethylpyrrolidine-N-oxide, urea hydrogen peroxide, peracetic acid, periodic acid, potassium dichromate, potassium chlorate, 2-nitrophenol, 1,4-benzoquinone, peroxybenzoic acid, peroxyphthalic acid salts, vanadium oxides, ammonium metavanadate, ammonium tungstate, sodium nitrate, potassium nitrate, ammonium nitrate, strontium nitrate, sulfuric acid, and combinations thereof.

20. The composition of claim 1, wherein non-aqueous components are present in the composition in an amount less than about 20 wt %.

21. The composition of claim 1, wherein the composition has a copper etch rate of less than 5 $Åmin^{-1}$ and a BTA removal efficiency greater than 20%.

* * * * *